United States Patent [19]

Kellenbenz et al.

[11] 4,042,830

[45] Aug. 16, 1977

[54] SOLID STATE PROGRAMMABLE DYNAMIC LOAD SIMULATOR

[75] Inventors: Carl W. Kellenbenz, Baltimore; James P. Goodman; Randall C. Rector, both of Annapolis, all of Md.

[73] Assignee: The United States of America as represented by the Secretary of the Navy, Washington, D.C.

[21] Appl. No.: 635,021

[22] Filed: Nov. 25, 1975

[51] Int. Cl.² ............................................. H02J 4/00
[52] U.S. Cl. .................................. 307/40; 324/158 R
[58] Field of Search ............................ 307/40, 41, 80; 324/73 R, 158 R, 121 R, 158 T; 219/10.55 B

[56] References Cited

U.S. PATENT DOCUMENTS

| | | | |
|---|---|---|---|
| 3,150,308 | 9/1964 | Kantner et al. | 307/80 X |
| 3,383,589 | 5/1968 | Dugan | 324/121 |
| 3,406,341 | 10/1968 | Kupferberger et al. | 324/158 R |
| 3,840,810 | 10/1974 | Fritts | 219/10.55 B X |
| 3,848,190 | 11/1974 | Houck et al. | 324/158 T |
| 3,849,726 | 11/1974 | Justice | 324/73 R |

Primary Examiner—Robert K. Schaefer
Assistant Examiner—Morris Ginsburg
Attorney, Agent, or Firm—R. S. Sciascia; Philip Schneider; George A. Montanye

[57] ABSTRACT

An improved system and technique for testing power source characteristics by simulating dynamic load power demand requirements using pulsating current waves. A plurality of load devices are connected in parallel across the output of a selected power source to be tested. Individual electronic switches are then inserted in series with each of a predetermined number of the loads to allow insertion of the load across the power source at selected times. Using a programmable logic control circuit, the switches are controlled to produce pulsating waves across the power source which simulate the input power demands of actual loads that may be applied to the power source during use. The logic control circuit is constructed to allow programming of plural pulsations per half cycle of an input waveform as well as variable frequency or random frequency control to allow detection of power source deficiencies under a variety of load conditions.

13 Claims, 9 Drawing Figures

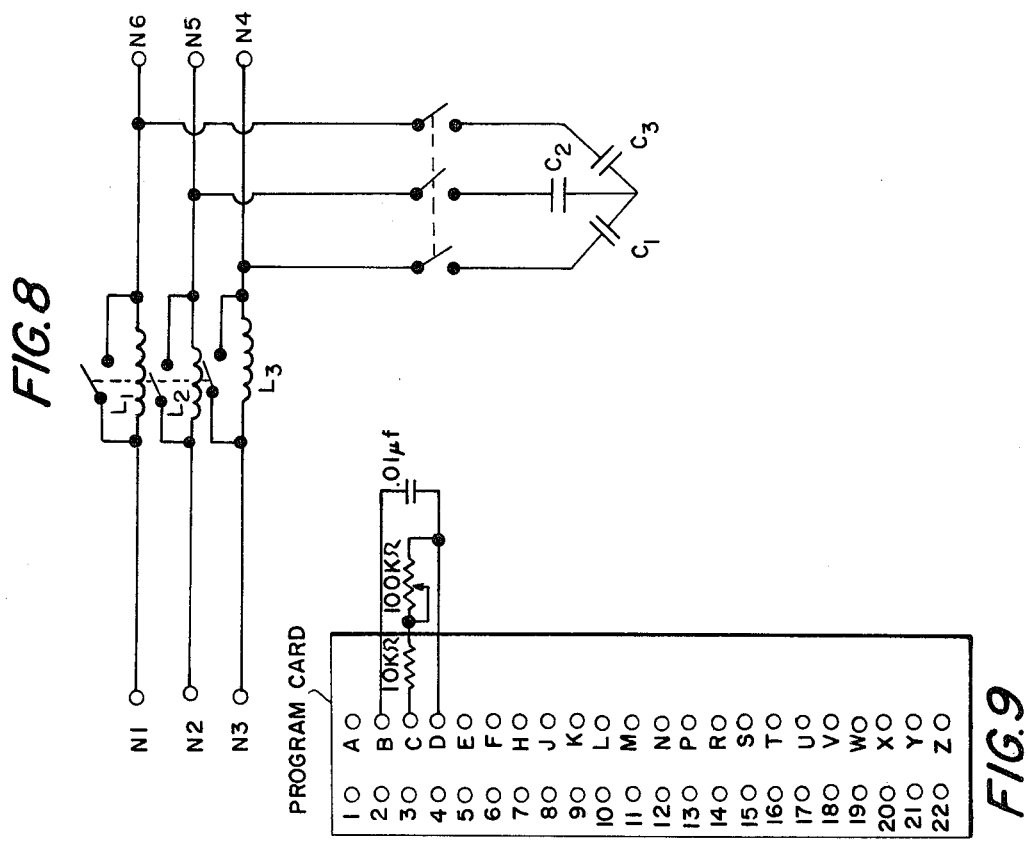
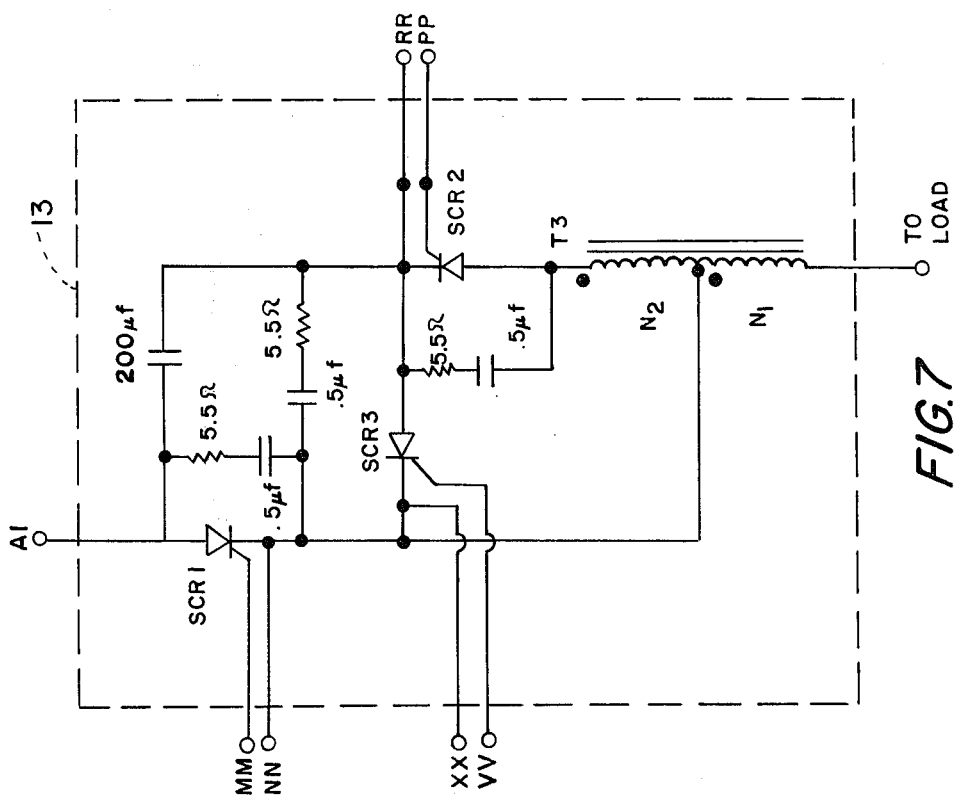

SOLID STATE PROGRAMMABLE DYNAMIC LOAD SIMULATOR

BACKGROUND OF THE INVENTION

The present invention relates to electronic test apparatus and more particularly improved techniques for simulating dynamic loads for power sources under various load conditions.

In the past, power sources have been designed to meet and exceed expected load requirements based on an estimation of the type and power rating of particular loads that may be utilized under various circumstances. It has been found, however, that dynamic loads under actual use conditions often create such disturbance on a power source as to drive the source out of specification on modulation and harmonic distortion to the point of rendering the power source waveform incompatible with other equipment that may also receive power from the same source. In extreme cases the power source may be so disrupted by the load conditions as to prevent the satisfactory operation of the dynamic load itself on the distorted and modulating waveform. In situations where power supplies are to be subjected to a variety of load conditions, therefore, it is often desirable to be able to determine how a particular power source will respond prior to installation, particularly where the installation situs does not readily facilitate power source replacement, such as aboard ships, aboard airplanes, or in remotely accessible areas.

In order to reduce the possibility of installation of deficient power sources, various techniques have been proposed to simulate the dynamic loads on various power sources to insure the compatibility of power source and loads such that power source characteristics will remain within specification limits prior to installation. In one such prior known device, power line commutated silicon controlled rectifiers were used to provide pulsations off the alternating current of the power source. In operation, the SCR's would therefore act to provide pulsations representing a variety of dynamic load conditions limited only by the action of the SCR's. While the above technique was useful in providing a limited number of dynamic load conditions, the same technique was severly limited due to the inability of the SCR's to be turned on more than one time during each half cycle of the applied waveform. In addition, the same technique is incapable of being used compatibly with both AC and DC power sources and therefore limits the versatility of the simulation system. In either case, the system does not allow much variety in selecting the load conditions that may be encountered by the demand requirements of plural loads.

Still other prior known systems have been proposed which also simulate load conditions encountered by the various power sources during use. For the most part, however, each of the devices is designed to solve a particular problem unique to the load utilized or the power source to be tested, and is therefore very limited in the extent of its application as a simulation system.

Accordingly, the present invention has been developed to overcome the shortcomings of the above known and similar techniques and to provide an improved technique for enabling programmed load simulation representing current demand of an electrical load or combination of loads that might be encountered in a power distribution system.

SUMMARY OF THE INVENTION

It is therefore an object of the present invention to provide an improved load simulation system having high reliability and greater versatility over prior known systems.

Another object of the invention is to provide a dynamic load simulating system that can be programmed to provide a variety of electrical loads in an electrical distribution system.

Still another object of the invention is to provide a programmable load simulating system that duplicates pulsating waves representing electrical current demand.

A further object of the invention is to provide a programmable dynamic load simulation system that can be used with both AC and DC power sources, either with or without power source synchronization.

Yet another object of the invention is to provide a programmable load simulating system which can be readily adapted for higher current operation with parallel control.

In order to accomplish the above and other objects, the present invention provides for the switching of loads by the forced commutation of SCR's on the DC side of the power source. By providing an AC to DC converter for an AC power source, the SCR's allow many pulsations to be provided for each half cycle of the input waveform. The SCR's are controlled by a thyristor firing circuit which is in turn controlled by a programmable digital logic circuit to create the desired waves. The programmable digital logic circuit translates the pulsation programming information from standard plug-in program cards into separate signals each of which commands one of the SCR power switches to open or close after processing by the thyristor firing circuit. The programmable logic creates the desired pulsating wave by dividing each cycle of the input waveform into a desired number of time periods which allows the selection of any combination of the electronic switches to create the wave on a cyclic basis. The logic circuitry can create the pulsating waves, representing the dynamic loads, in synchonization with the AC power or some other external source. In addition, the logic circuitry is capable of providing signals to the SCR switches such that the pulsating waveforms occur at random frequency and vary randomly in amplitude. The programmable logic can create a pulsating wave that repeats on a cyclic basis or it can create a pulsating wave on a power source on a one-shot basis (not repeated on a cyclic basis). The one-shot pulsating wave is useful to evaluate certain power sources which anticipate what will happen in the future (based on what happened during the initial pulsating wave) and correct for the next up-coming pulsation. The one-shot pulsation provides the capability of determining any initial instability of these type power sources. In addition this invention allows the harmonic content of the input current to the simulator to be readily varied by the use of 6 phase, 12 phase, 24 phase . . . etc., transformer/rectifier combinations (AC to DC converter) rather than the 3 phase full wave bridge type AC to DC converter that is presently used for the DC supply for the electronic switches. The harmonic content is controlled by using the AC to DC converter with the proper number of phases (proper connections of multiple secondary windings on the transformer) in conjunction with the input line filter. This harmonic control is possible because the high current switching is performed on the DC source (output of AC to DC converter) rather than on the AC source (certain harmonics cancel out due to the phasing of the transformer of the AC to DC converter). Thus, by only a simple modification of a conventional plug-in card, a variety of simulator functions can be provided to allow any combination of electrical load to be simulated in an electrical power system employing AC or DC power sources.

Other objects, advantages and novel features of the invention will become apparent from the following detailed description of the invention when considered with the accompanying drawings wherein:

BRIEF DESCRIPTION OF THE DRAWINGS

FIGS. 2-9 are detailed schematic diagrams of the electrical circuits utilized in FIG. 1.

DETAILED DESCRIPTION OF A PREFERRED EMBODIMENT

Figure 1:
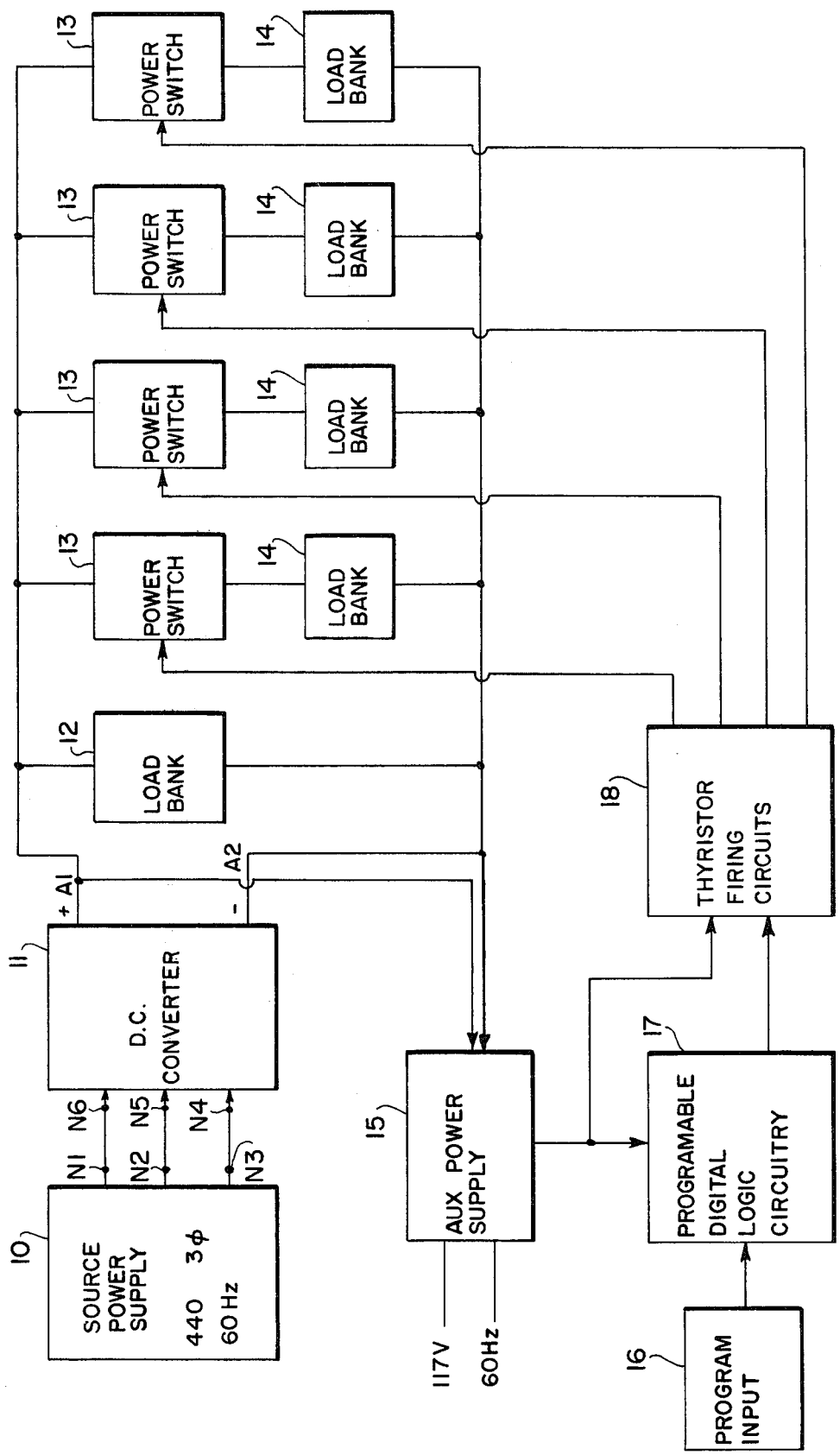
FIG. 1 is a schematic block diagram showing the load simulator system according to the present invention.

Turning initially to FIG. 1, a schematic diagram of the overall system is shown illustrating the simulator combination according to the present invention. The power source 10 generally represents the power source that is to be tested prior to installation to insure that its characteristics are within specifications for any load conditions that may be encountered. While in the present example the source 10 is shown as an AC 440 volt 3 phase 60 to 400 Hz power source, as might be supplied by a motor generator set aboard ship, it is to be understood that source 10 can be any power source for which dynamic load tests are desired. The output of the power source 10 is coupled to a conventional DC converter 11 which converts the 3 phase input AC to a DC output voltage at A1, A2. By way of example, DC converter 11 can comprise a 3 phase transformer which converts the 440 volts AC to 120 volts AC and, through a 3 phase full wave rectifier, provides 170 volts DC (peak) at the output A1, A2. The DC converter could also be of the multiphase (6 phase, 12 phase . . . etc.) type chosen to eliminate certain harmonic currents in the input to the simulator. The purpose of the DC converter is to provide DC output at A1, A2 in order to allow an increased pulsing capability from electronic switches 13 in contrast to the limited pulsing capabilities of prior art systems.

As is known, nearly all realistic power systems will have a combination of pulsating and non-pulsating loads both linear and non-linear, providing the total load to a power source and forming the distribution system. In the present example, the power source 10 is loaded through DC converter 11 by the loads 12 and 14 coupled between the DC output terminals A1 and A2. In this instance the load bank 12 is used to simulate a non-pulsating load of the simulator system and can be, for example, any resistive load providing a continuously variable power load to the source 10. The pulsating portion of the load is then provided by a plurality of load banks 14, each coupled in series with individual electronic switches 13 between the DC output terminals A1 and A2. The load banks 14 can be of the same type as load 12 which in the present example were resistive loads continuously variable over a range of 0-55 kw. In order to provide the pulsating portion of the load, electronic switches 13 are controlled to switch on and off at various intervals under the control of thyristor firing control circuits 18. The circuits 18 are in turn controlled by logic signals from programmable digital logic circuit 17 as programmed by programming input 16. Power is provided to drive the circuits 17 and 18 by an auxiliary power source 15 coupled to supply power in response to a DC voltage at terminals A1 and A2 as will be described with reference to FIG. 2.

Briefly, by way of example, the present system simulates a dynamic load with large amplitude variations in the pulsating current, by programming various combinations of the switches 13 to insert selected values of resistive loads 14 across the DC output for selected time intervals. If, for example, a pulsation equivalent to an 11 kw load was desired to be followed by a 7 kw load pulsation to simulate a power source load, and the loads 14 had values set at 1 kw, 2 kw, 4 kw, and 8 kw for each of the four switches 13 respectively, load pulsations could be provided by controlling the switches 13 to insert the 1 kw, 2 kw, and 8 kw load during a first interval to provide an 11 kw total and by controlling the switches 13 to insert the 1 kw, 2 kw, and 4 kw loads during the next interval to provide the 7 kw total. In each interval, all loads inserted by the switches would be connected across the DC output at terminals A1 and A2 to draw current while the unused loads would be disconnected by their corresponding switches. Naturally, by programming the intervals during which the switches 13 are controlled to insert the loads, and by changing the selected values of the loads 14, any desirable dynamic load conditions within the limitations of the switching capabilities of the electronic switches can be applied to the power source 10.

As will be subsequently described with more particular reference to units 16-18, the pulsation programming information is provided by conventional plug-in cards which can be easily replaced to provide a plurality of programming selections from 16. The programmable digital logic circuit 17 translates the information from the plug-in cards at 16 into a plurality of separate control signals, each of which controls one of the electronic switches 13 to be on or off at selected intervals after processing by the thyristor firing circuits 18. According to the present invention, the unit 17 provides the capability of creating the desired waveform by dividing each cycle of the input AC waveform into from 2-24 equal time periods. The program card 16 selects the desired number of time periods as well as the combination of switches 13 that are to be on for each of the up to 24 time periods. This allows a desired pattern of current pulsations to be provided to load the source 10 over the possible 24 time periods and repeated on a cyclic basis. These pulsations can be provided either with or without synchronization with the zero crossings of the input AC power or some other source as will be detailed with reference to circuit 17. Additionally, the switches 13 can be controlled to provide simulator pulsations varying randomly in frequency and amplitude.

Before turning to a more detailed description of the individual circuits of FIG. 1, it should first be noted that the present invention comprehends the use of a filter circuit inserted between the source 10 and converter 11 as more specifically shown by FIG. 8. The filter circuit is connected to the correspondingly labeled terminals N1-N6 in lieu of direct connections between the units 10 and 11 to provide a more realistic load simulation to the source 10. Because of the particular combination of electronic switches 13 controlling DC current from converter 11, the pulsating action of the simulator and its rectifier power supplies is abrupt and harsh in comparison to what actually might be encountered under realistic load conditions. The network is therefore provided to cooperate with the load conditions of the simulator to produce a more realistic load on power source 10. As seen in FIG. 8, the filter consists of a plurality of inductors L1, L2, and L3 connected in series with each of the input lines at terminals N1-N3. Each of the inductors is shunted by a switch which can be operated jointly with the other inductor switches to either insert or remove all inductors simultaneously in series between terminals N1-N6, N2-N5, and N3-N4. Additionally, capacitors C1-C3 are connected in shunt across the inductors as shown and also provided with a switch to allow simultaneous insertion or removal of all capacitors. In operation, the switches are operated to insert either all inductors and all capacitors simultaneously or all inductors at one time and all capacitors at another time, depending on the nature of dynamic load being simulated. While the values of inductors and capacitors required are largely dependent on the power source impedance and dynamic load being simulated, typical values for a 60 kw motor generator set as power source 10 would be: inductors of 170 microhenries and capacitors of 5 microfarads.

Figure 2:
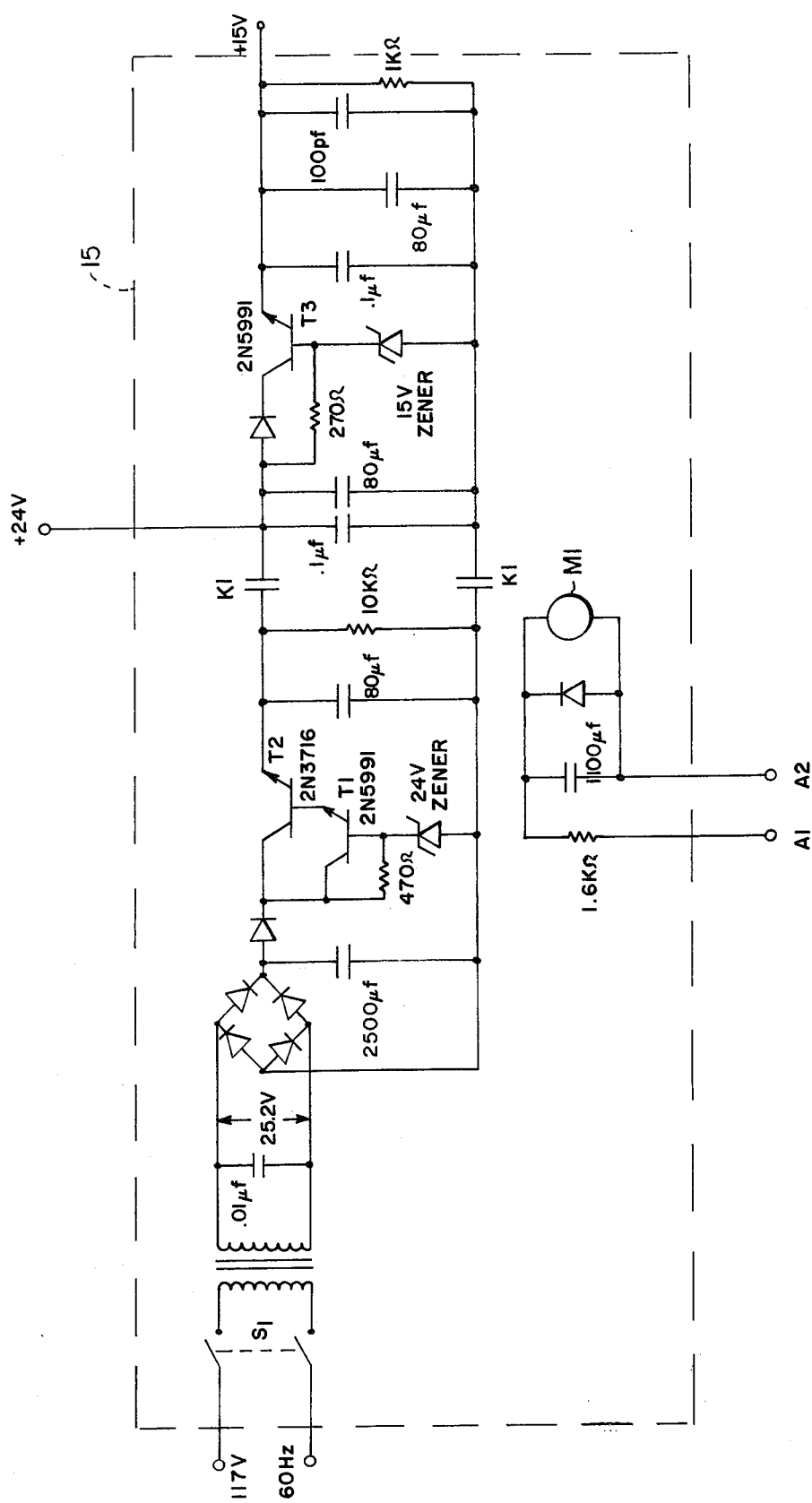

Turning now to FIG. 2, the power supply 15 is shown in more detail. Generally, any external power supply designed to provide the proper DC voltages for circuits 17 and 18 can be utilized. By using a separate power supply instead of voltage derived from the input source 10, interference from the pulsating voltage loading the source can be isolated from the control circuits 17 and 18 to prevent misfirings. In the present example standard 117 volt 60 Hz AC power is coupled through switch S1 to a conventional stepdown transformer to provide an output of 25.2 volts across a 0.01 μf capacitor to a full wave rectifier. The output of the rectifier is then coupled through a regulating circuit to transistors T1, T2, and 24 volt zener diode to provide a 24 volt output across the output as shown in the drawing. This 24 volt output is in turn coupled to a regulating circuit including transistor T3 and a 15 volt zener diode to provide a 15 volt output as shown in the drawing. Relay contacts K1 are in series with the output lines providing the 24 volt DC voltage and are coupled to the relay M1 such that contacts K1 close when the relay is energized to provide the 24 volt and 15 volt outputs to the circuits of FIGS. 3-6. The relay coil M1 is coupled to terminals A1 and A2 through the illustrated circuit such that the relay coil M1 will be energized to delay the application of the 24 volts to the control circuit until after the 170 volt DC has been applied. This relay circuit prevents the DC choppers from latching in the closed state due to noise currents that flow from the power circuit to the thyristor firing cirucit when the input power transformers of the AC to DC converter are energized. Since the relay contacts break the connection back to the 117 volt AC power supply, no noise current can flow through the firing circuits and back to the 117 volt AC line at the instant when the AC to DC converter is energized.

Figure 3:
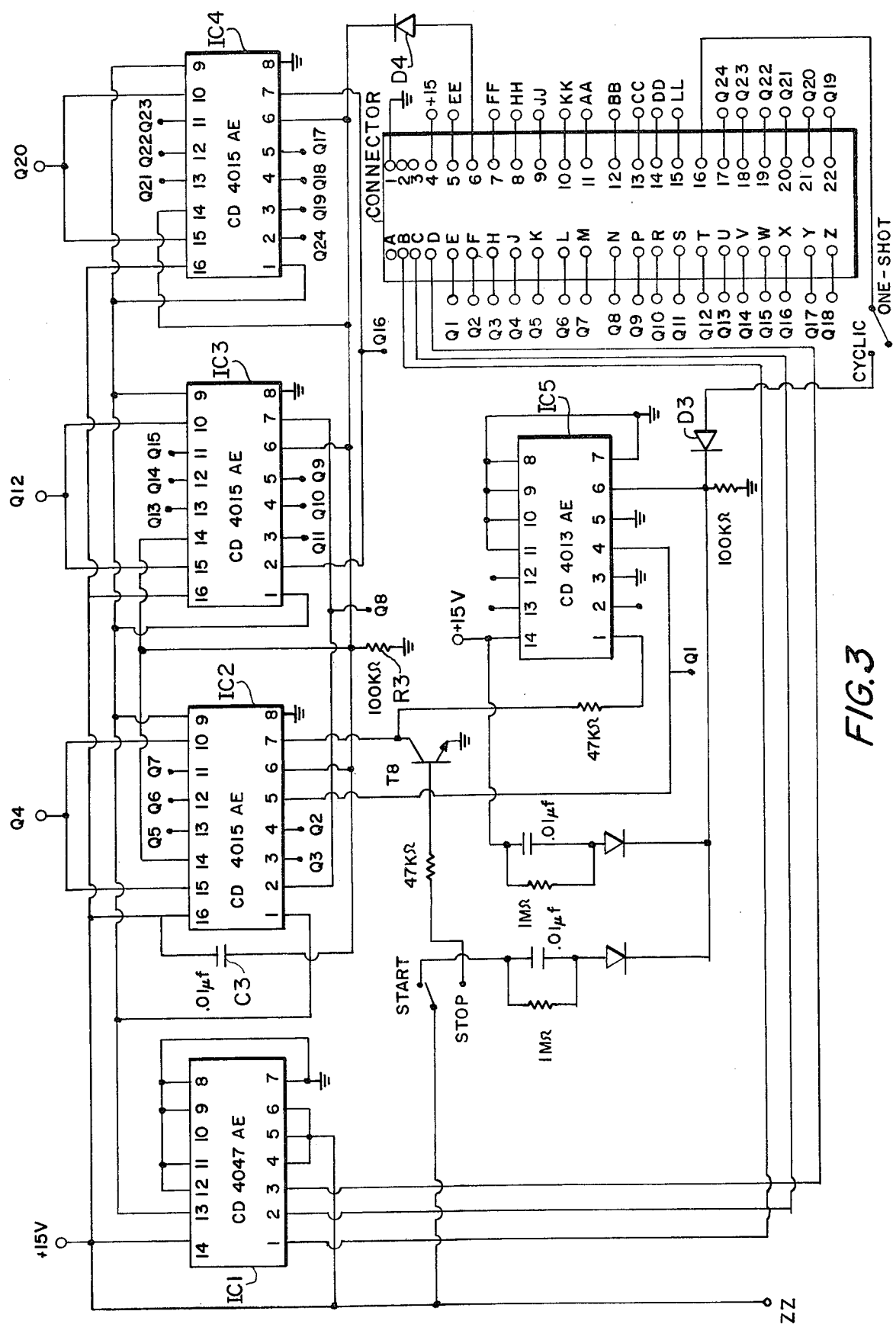
Figure 4:
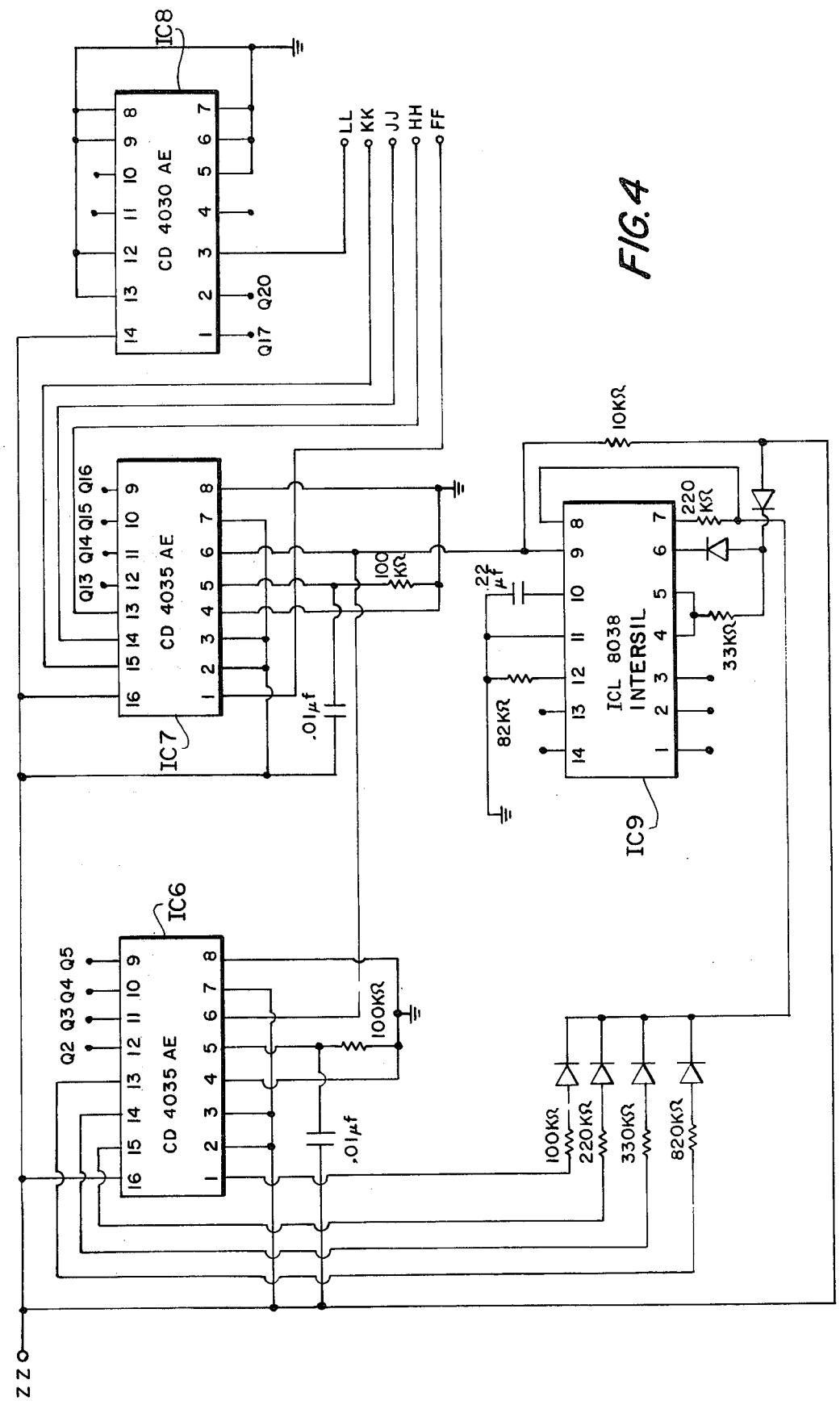
Figure 5:
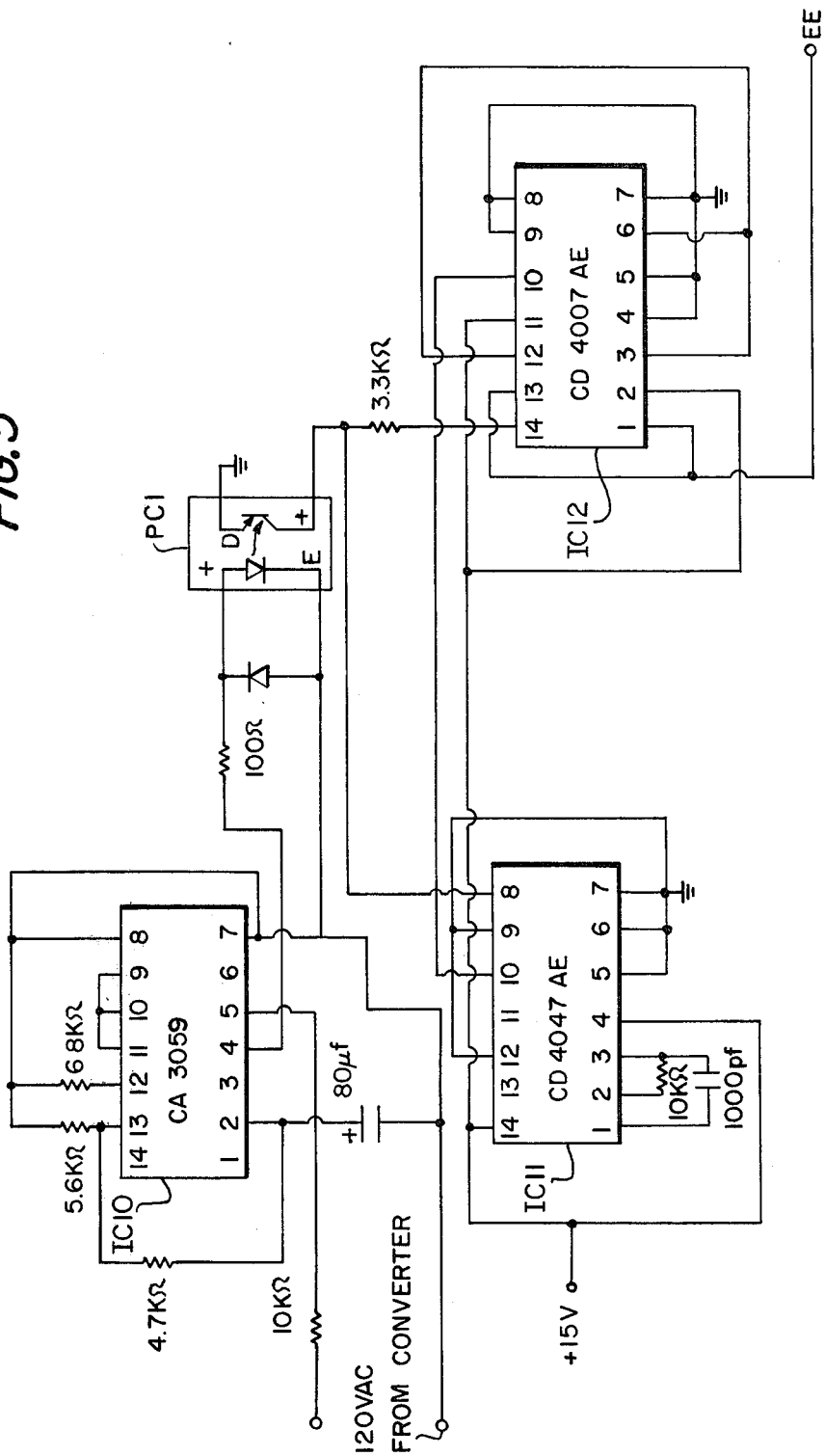

Referring now to FIGS. 3-5 and 9, the construction and operation of the units 16 and 17 will now be described. FIGS. 3-5 generally represent the various components that make up the digital logic circuits 17 while FIG. 9 illustrates a conventional plug-in program card that can be utilized according to the present invention. It should be noted in reference to the particular integrated circuits that the same are RCA type IC's specified by their identifying numbers in the drawing, except for IC9 in FIG. 4 which is a model ICL 8038 integrated circuit made by Intersil Corporation of Cupertino, California. Likewise, all references to transistors are by their conventional identifying numbers. It is to be understood that while particular IC's have been specified, any equivalent IC's or components performing the same functions could be substituted in their place. The digital logic circuitry of 17 is implemented with integrated circuits IC1-IC12 interconnected to provide the timing and logic controls as previously referred to. In FIG. 3 IC1 is wired as an astable multivibrator and is utilized to provide clock pulses from pin 13 to each of the dual 4 bit static shift registers at pins 1 and 9 of IC2, IC3, and IC4. Pins 1, 2, and 3 of IC1 are wired to the pins B, C, and D of a conventional female connector card constructed to receive a conventional male plug-in program card as shown in FIG. 9. Each plug-in card has two rows of pins A-Z and 1-22 capable of making mating electrical contact with the correspondingly labeled female pins in the connector. Each plug-in card is wired as shown in FIG. 9 to have a variable RC circuit connected to the B, C, and D terminals such that the clock frequency of IC1 can be controlled by the RC circuit to in turn control the repetition rate of the simulated pulsating current waveform. The integrated circuits IC2, IC3, and IC4 are wired to form a 24 bit string of D type flip-flops as shown in the drawing. In operation the logic level present at the input to pin 7 of IC2 is transferred into the first register stage and shifted over one stage (bit) for each positive going clock pulse transition provided by pin 13 of IC1. At the start of each operation when the 15 volt power is supplied from the source 15 to the circuitry of FIG. 3, the reset terminals of IC2-IC4 (pins 6 and 14 of each IC) are pulsed with a logic "high" by the initializing circuit (C3, R3) to reset all the Q outputs (Q1-Q24) to logic "lows". IC2, IC3, and IC4 will then be clocked by IC1 but no logic highs will appear at the Q outputs until a logic high is entered at pin 7 of IC2. This is accomplished by moving the start-stop switch to the start position such that 15 volt bias source provides a logic high to pin 6 of the dual D flip-flop IC5 and sets the flip-flop causing the output from pin 1 of IC5 to go to a logic high. At the same time that the switch is thrown to the start position, the base current to transistor T8 is also interrupted causing T8 to become non-conductive and allowing the logic high from pin 1 of IC5 to be entered at pin 7 of IC2 on the first positive going clock pulse transition after T8 becomes non-conductive. The output of the first D flipflop (pin 5 of IC2) is fed back to pin 4 of IC5 to reset the D flip-flop IC5 once the logic high has been entered into the 24 register string. Resetting of IC5 will cause a logic low to appear at pin 1 and will thus provide logic low entries (at pin 7 of IC2) into the 24 bit register until the flip-flop IC5 is again set by a logic high received at pin 6 of IC5. The logic high that was entered, however, will be shifted down one bit position in the 24 bit register for each positive going clock pulse transition provided by IC1 and will circulate through a number of bit positions fixed by the plug-in program card. By way of example the card can be wired to allow a logic high to circulate through as few as two registers (bit positions) or as many as all 24 registers. This is accomplished by connecting a jumper cable on the program card from the pin corresponding to the Q output of the last storage register through which it is desired to let the logic high circulate, to the terminal 16 also on the program card. This causes a logic high from the selected Q output at the connector terminal to be transmitted to pin 16 of the connector terminal which in turn transmits the logic high through a diode D3 to pin 6 of IC5. This in turn causes a logic high from pin 1 of IC5 to be entered into the register string at pin 7 of IC2 ito initiate the cycle again. In order to insure that the Q output of the shift registers further down the string from the programmed end are always at logic lows, the register Q output on the connector terminal which corresponds to the programmed end of the register string is also coupled (by a shorting cable on the plug-in-card) to pin 6 of the connector to apply a logic high to all reset terminals (pins 6 and 14) through diode D4. Thus, by appropriate selection of the Q output for coupling to pins 16 and 6 of the connector terminal, any desired number of shifts from 2-24 through the shift registers can be programmed and the shifting will cyclically repeat until the start-stop switch is placed in the stop position. When this happens, T8 receives a base current rendering it conductive thereby forcing pin 7 of IC2 to remain at a logic low and stopping the cyclic process. If, however, a logic high were entered at pin 7 of IC2 prior to transistor T8 becoming conductive, the logic high would shift to the programmed end and then stop due to the logic low maintained by the conductive transistor T8. In the present example the 47 KΩ resistor is provided in the output from pin 1 of IC5 to prevent overloading of IC5 when pin 1 is a logic high and T8 conducting. By throwing the switch that is in series with pin 16 of the program card connector from the "cyclic" to the "one-shot" position, the simulator can be used to provide a sequence of pulsations on a one-shot basis. This is accomplished by breaking the path that allows the logic high to be entered into the control flip-flop IC5. Since this path is broken the logic high from the end of the register will not be entered into the register again until the start-stop switch is flipped to stop and then to start again.

According to the above embodiment, logic highs can be produced at the Q outputs (Q1-Q24) and controlled as to total shift registers (from 2-24) through which any logic high is circulated for each cycle. As shown in FIG. 3, each of the Q outputs is coupled to an individual terminal on the connector card. By using the plug-in card, thereafter, any of the Q output signals can be coupled to the connector output terminals AA, BB, CC, and DD which provide the control signals to thyristor firing circuits 18. This is accomplished by providing shorting cables on the plug-in card between the pins on the plug-in card (E-Z and 17-22) corresponding to desired Q outputs of the connector terminals and the terminals 11, 12, 13, and 14 on the plug-in card. In practice a diode should be inserted in series with each of the shorting cables to allow one or more of the Q outputs to be coupled to any one of the pins 11, 12, 13, and 14 on the plug-in card. By way of example, if the register string were programmed to provide a 24 bit sequence (pin 17 on program card shorted to pins 16 and 6 on program card) and a jumper provided from pin E on the program card through diodes to each of the pins 11, 12, and 14, the logic high at the output of Q1 would cause logic highs to appear at the outputs AA, BB, and DD. Since these outputs are used to control the electronic switches 13 through thyristor firing circuits 18, three of the four load banks (and their selected resistive values) would be switched across the DC converter to produce a specific current pulsation level during the presence of the Q1 output. Additional connections of Q2-Q24 through diodes to outputs 11-14 in a similar manner would therefore produce variable current levels for each shift position (Q1-Q24) thereby providing 24 discrete current amplitude segments. The only consideration, however, is that the clock IC1 must operate at a frequency of 24 times the frequency of the input waveform if it is desired to have 24 discrete segments per cycle of the input waveform.

By using the above operation and connection of the integrated circuits IC1-IC5, a cyclic repetition of pulsating waveforms can be provided. However, by utilizing the circuits IC6, IC7, IC8, and IC9 of FIG. 4 in conjunction with IC1-IC5, a pulsating current waveform (i.e., current through the load banks 14) that varies randomly in pulsing frequency and pulse current amplitude can easily be created for specific applications. To create such waveforms, a plug-in program card is used which connects terminals 7, 8, 9, 10, and 15 to terminals 11, 12, 13, 14, and 16, respectively, with shorting cables on the plug-in-card. The control signals for the electronic switches 13 are then derived from the outputs at AA, BB, CC, and DD from the connector terminals with each terminal providing a pulse train that randomly varies in frequency over a 20-1 frequency range and follows no noticeable repetition patterns.

The above random pulse train is obtained by generating a linear sequence by entering a logic high into the register string of IC2-IC4 as disclosed above in reference to FIG. 1. The outputs from the 17th register (Q17) and the 20th register (Q200) of the D type flip-flops of IC4 are then coupled to pins 1 and 2 of the quad-exclusive OR-gate (IC8) to make a determination of similar or different outputs. If the logic outputs from Q17 and Q20 are similar, a logic low is entered from terminal 3 of IC8 (output LL) to terminal 6 of IC5 (through the shorted terminals 15 and 16 on the plug-in program card) and thus to the register string of IC2--IC4 via pin 7 of IC2. If the outputs are different, a logic high is entered through the same route from terminal 3 of IC8 to produce a logic high at the input to pin 7 of IC2. This connection from IC8 to IC5 generates a pseudo-random sequence of pulses that repeats in accordance with the formula $P = 2^n - 1$ where $P =$ length of sequences in bits and $n =$ number of D flip-flops in the string. In the present example 20 bit string was chosen to generate the pseudo-random sequence thereby providing a repeat of the sequence after $P = 2^{20} - 1$ or 1,048,75 bits have circulated through the string. A completely random sequence is then obtained by combining the pseudo-random sequence generation with the 4 bit parallel in/parallel out shift registers IC6, IC7, and the voltage controlled oscillator IC9. Input to IC7 is taken from four of the pseudo-random sequence Q outputs (Q13, Q14, Q15, Q16) of the register string shown in FIG. 3. While those four specific outputs are identified, any four Q outputs of the shift register string could be used to provide pulses at each input to IC7 which would vary pseudo-radomly. At the same time a clock signal is derived from the pseudo-random frequency portion of the circuitry to provide a random frequency clocking pulse to pin 6 of IC7. This random frequency clocking pulse is derived by coupling the pseudo-random outputs Q2-Q5 to the input pins of 4 bit parallel in/parallel out shift register IC6. The outputs from pins 1, 13, 14, and 15 of IC6 are then coupled to a digital to analog converter consisting of a binary weighted ladder made up of resistors having the values 100 KΩ, 220 KΩ, 330 KΩ, and 820 KΩ and their associated diodes. Combinations of logic highs from the outputs of pins 1, 13, 14, and 15 therefore roughly represent a digital proportion of 1, 2, 4, and 8 allowing the creation of 16 discrete analog voltage levels at pin 8 of IC9. IC9 is utilized as a voltage controlled oscillator connected such that the output (clock) frequency from pin 9 is dependent on the voltage output of the D/A converter connected to pin 8, which in turn is dependent on the 4 bit pseudo-random sequence sampled from the 24 bit register string (Q2–Q5). In order to make the clock frequency from pin 9 of IC9 completely random instead of pseudo-random, the output pin 9 of IC9 is connected to clock pin 6 of IC6 to produce a feedback loop which, when completed, causes the output of pin 9 of IC9 to be a completely random clock frequency. Since IC7 is clocked at a random frequency, the pseudo-random pulse sequence at the input to IC7 (from Q13–Q16) will be randomly sampled and transferred to the output lines of IC7 where they will be provided to terminals FF, HH, JJ, and KK. These same random frequency outputs will then appear at the output terminals AA, BB, CC, and DD, respectively, due to the previously designated wiring of the plug-in program card, and will vary randomly in pulse sequence and instantaneous frequency for control of the switches 13 through thyristor circuits 18. It should be noted that the signal out of the D/A converter causes the frequency out of the voltage controlled oscillator to vary randomly over a 20–1 frequency range.

The digital logic circuitry 17, in addition to the above functions, can also be utilized to provide still another function as will be described with reference to FIG. 5. This function provides the capability of synchronizing the pulsating waveform created across the DC converter by switch 13, with the zero crossing of the input AC source (source 10) or any other external AC signals. According to the embodiment shown in FIG. 5, the pulsing is to be synchronized with the zero crossing of the AC power source 10 by sensing the 120 volt AC from the AC transformer in the converter, although it is obvious that the pulsations could also be synchronized with any other external AC source by substituting that source for the 120 volt AC in FIG. 5. In the present example the synchronization is developed by coupling pins 5 and D together on the plug-in program card and coupling the 120 volt AC to IC10 to detect the zero crossing. IC10 produces an output pulse at pin 4 when the zero crossing is detected. This pulse is coupled to photo-coupler PC1 which translates the pulse from IC10 to the proper logic signal level for driving monostable multivibrator IC11 and at the same time isolates the relatively low level DC logic circuits of IC11 and IC12 from the 120 volt AC input power. The pulse from PC1 is used to trigger IC11 which in turn provides a 20 microsecond output pulse at pin 10 (IC11). This pulse is coupled to pin 10 of the dual complementary pair plus inverter IC12 which processes the pulse from IC11 and provides an output logic high from terminals EE to be delivered to pin 3 of IC1 (through the plug-in program card terminals 5 and D) causing pin 3 of IC1 to go to a logic high at the zero crossing. In this embodiment IC11 is used for the purpose of shortening the pulse that is produced by IC10 when the zero crossing occurs, since the pulse that must be provided to synchronize the clock (IC1) must be short with respect to the clock period in order to synchronize the clock in one clock period and avoid jitter.

Figure 6:
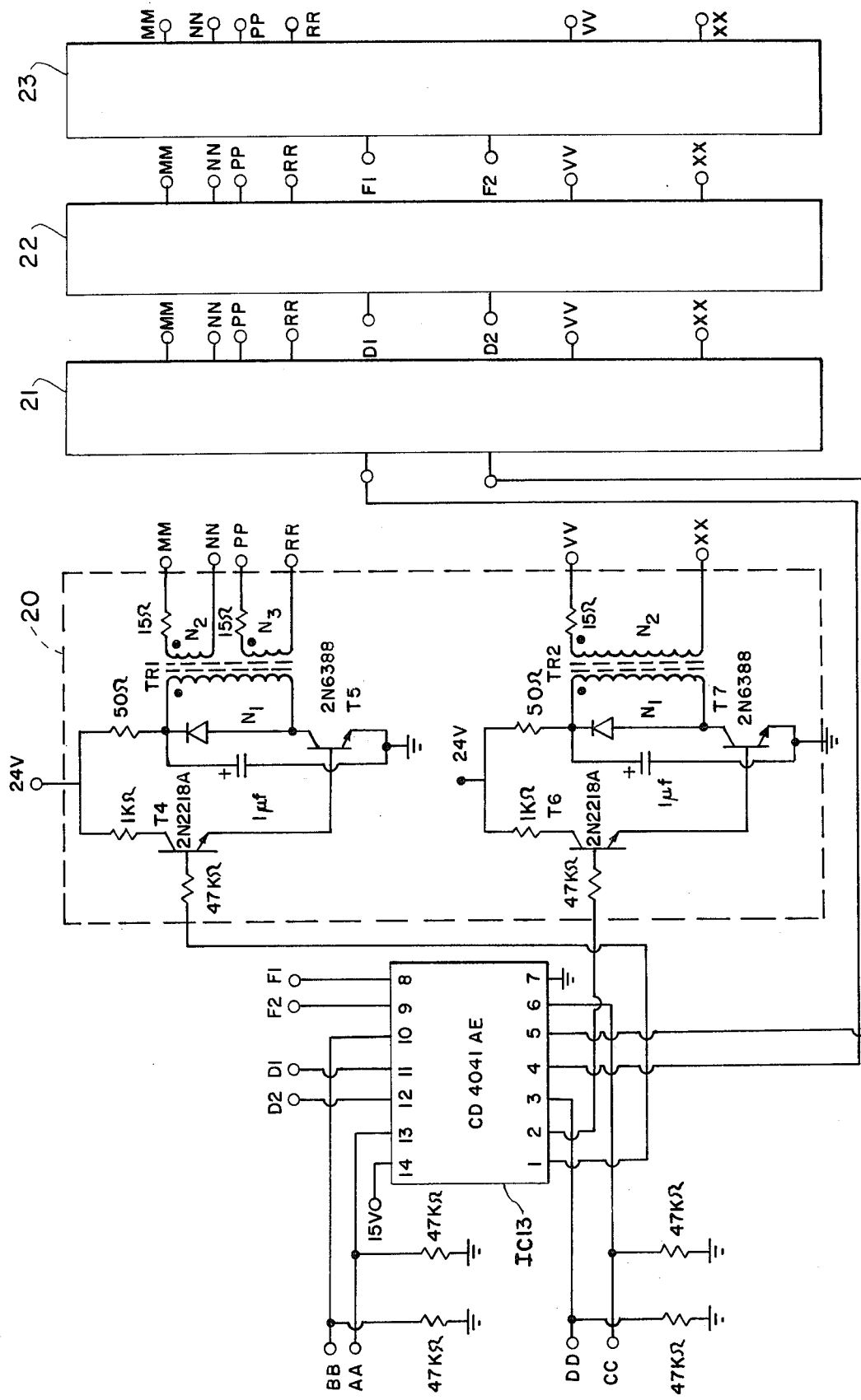

Turning now to FIG. 6, the logic outputs from terminals AA, BB, CC, and DD are applied to the corresponding terminals at the input to IC13 as shown. IC13 is a digital true complementary buffer circuit which receives logic signals from AA, BB, CC, and DD and provides buffered signal outputs of the same logic levels from pins 1, 4, 8, and 11. At the same time, complementary outputs are provided at the associated output pins 2, 5, 9, and 12 which have a logic level the opposite of that appearing at pins 1, 4, 8, and 11. The logic signals from pins 1, 2, 4, 5, 8, 9, 11, and 12 are then applied as shown to the thyristor firing circuits 20–23. Since each of the circuits 20–23 is identical, a description of the construction and operation of one will be sufficient to explain the others. By way of example, if a logic high is provided at terminal DD, a buffered logic high will be provided from terminal 1 of IC13 through a 47 KΩ resistor to the base of transistor T4. At the same time, a logic low will be provided from terminal 2 of IC13 and coupled through a 47 KΩ resistor to the base of T6. When the logic high is received at T4, T4 is gated to conduct which in turn provides a pulse from the 24 volt source to drive T5 to conduction. The 1μf capacitor (having been previously charged by the 24 volt source) will discharge through windings N1 of TR1 when T5 is driven into conduction thereby creating pulses at the output windings N2 and N3 (terminals MM, NN and PP, RR) which are coupled to one of the electronic switches 13. When the logic high at the base of T4 changes to a logic low the capacitor is allowed to again charge and the complementary signal at T6 becomes a logic high (this is caused by DD terminal changing from a logic high to a logic low thereby changing pin 1 of IC13 to a logic low and pin 2 of IC13 to a logic high). When T6 is driven into conduction by the logic high, T7 is also driven into conduction in the same manner as T5 and discharge of the 1 μf capacitor through winding N1 of TR2 produces an output pulse across the output of N2 (terminals VV, XX). In the present example TR1 had windings of N1 = N2 = N3 = 100 and TR2 had windings of N1 = 100 and N2 = 30. The pulse outputs from terminals MM, NN and PP, RR of TR1 and VV, XX of TR2, of each of the circuits 20–23, are then coupled to drive a separate one of the switching circuits 13 as shown in FIG. 1. It should be noted here that the firing circuits 20–23 are specifically designed to provide high gate drive signals to the thyristors of the electronic switches 13 to insure fast turn on in response to any signals from the terminals AA, BB, CC, and DD such as to provide satisfactory operation of the switches into loads where the rate change of current is very high (on the order of 100 amperes per microsecond).

The signal outputs from 20–23 (outputs from 18) are supplied to the electronic switches 13 as more particularly shown in FIG. 7. Generally, each of the switches 13 is a modified version of the basic Jones type DC chopper circuit as illustrated on pages 369–382 of the fifth edition of the General Electric SCR Manual. Instead of being used to control a DC motor however, the switch is connected to receive DC output from converter 11 at point A1 in FIG. 7 and deliver current through a resistive load 14 to the A2 terminal as shown in FIG. 1. In addition, the circuits 13 are designed to be switched in response to the digital logic control signals as provided from 18 by circuits 20–23. Since the operation of the circuit is similar to the conventional Jones type chopper circuit, a detailed explanation of circuit operation is not considered necessary. Generally, however, when a pulse is received across the inputs MM, NN and PP, RR in response to a logic high at the input to T4 of any of the circuits 20–23, SCR1 and SCR2 will receive gating pulses which cause them to conduct. Current from the converter 11 at terminals A1 and A2 follows a path through SCR1 and autotransformer T3, through a load 14, and then to the A2 terminal of the DC. As the current is drawn through T3 the action of the autotransformer causes the 200 µf commutating capacitor to be charged through the current path including SCR2. When the signal to T4 changes from a logic high to a logic low thereby causing the signal input to T6 to go to a logic high, the pulse output from VV, XX causes SCR3 to conduct to discharge the 200 µf capacitor through the path including SCR3 and SCR1 to reverse bias SCR1 and stop conduction of SCR1. As can be seen, therefore, the effect of the train of logic signals provided by unit 17 is to cause switches to alternately be conductive and non-conductive to provide a pulsating current load to power source 10 during intervals selected by the plug-in program card 16 and digital logic circuit 17.

As can be seen from the above description, the present invention allows the simulation of a variety of pulsating waveforms representing a dynamic load on power source 10. By using a variety of plug-in program cards, various dynamic loads can be selected to subject a source to substantially any anticipated load condition. As disclosed the present invention is capable of providing up to 24 pulsation periods per cycle of the input AC either with or without synchronization as well as random frequency variation over a 20–1 ratio simultaneous with random amplitude variations. In addition, pulsations can be provided on a cyclic (repeated) basis or on a one-shot basis. All of these advantages not found in the prior art as previously mentioned.

In addition to the above advantages the simulator is capable of switching currents up to 1600 amperes at frequencies up to 2 kHz to create current pulsations. The simulator can be used to provide pulsations on any type AC power source by changing the AC to DC converter to provide conversion of the AC power to approximately 170 volts DC. Pulsations can then be provided on essentially any frequency 3 phase AC power source or even on single phase AC power. The unit can also be used to provide pulsations on DC sources up to 250 volts as presently developed by eliminating the AC to DC converter and filter and connecting the electronic switches 13 and loads 12 and 14 directly across the DC source. In addition, the power inputs of several simulators can be coupled to the same power source in order to allow higher current pulsations than can be obtained with one simulator. For example, the outputs AA, BB, CC, and DD can be parallel-connected to a plurality of thyristor firing circuits of additional simulators. In that case one unit would act as a master unit programming the desired pulsations with the logic signals being provided to all the thyristor circuits through parallel connections. It should be noted that transistor drive circuits might be required in the case of parallel connections to multiple simulators in order to insure maintenance of the square waveforms for thyristor drive.

Obviously many modifications and variations of the present invention are possible in light of the above teachings. Recently, 400 ampere, 300 volt transistors have become available. Incorporation of these transistors into the simulator in place of the SCR type DC choppers allows increasing the pulsing frequency capability of the simulator from 2 kHz to between 10 and 20 kHz. Other modifications and variations of this type are possible for this invention. It is therefore to be understood that within the scope of the appended claims the invention may be practiced otherwise than as specifically described.

What is claimed and desired to be secured by Letters Patent of the United States is:

1. A dynamic load simulator for providing simulated dynamic loads to power sources comprising:
   input means for receiving input power from a power source and for providing a voltage output;
   means, coupled to receive said voltage output for providing a variable load to draw current from said power source, said means comprising a plurality of resistive loads;
   electronic switch means coupled to each of said resistive loads and operable when energized to cause selected ones of said resistive loads to draw current;
   logic means coupled to said switch means for energizing said switch means in response to program signals; and
   program means coupled to said logic means for providing program signals to said logic means at selected intervals to energize said electronic switch means and produce a dynamic load on the power source.

2. The system of claim 1 wherein said input means includes:
   a filter circuit coupled to receive power from an AC power source and provide a filtered output; and
   DC converter means coupled to said filter circuit for converting the AC filtered output to a DC voltage forming said voltage output.

3. The system of claim 2 wherein said filter circuit is coupled to receive power from a plural phase AC power supply and further wherein said filter circuit comprises;
   an inductor coupled in series between each phase of said AC source and said DC converter means,
   first switch means for selectively shorting each inductor,
   a plurality of capacitors each having a first terminal coupled to a common point and a second terminal, and
   second switch means coupled to the second terminals of said capacitors for selectively coupling each second terminal to a different phase of said power source.

4. The system of claim 1 wherein said logic means includes;
   clock means for providing a train of clock pulses, and
   pulse means responsive to said clock pulses and said program signals for providing a plurality of pulse outputs for energizing said electronic switch means.

5. The system of claim 4 wherein said program means comprises a program card removably coupled to said logic means and so constructed as to provide program signals to said pulse means to produce said pulse outputs at a predetermined frequency and to cause said pulse outputs to form a predetermined pattern of signals for energizing said electronic switch means.

6. The system of claim 5 wherein said logic means further includes means for selecting said predetermined pattern to be provided on a cyclic or one-shot basis.

7. The system of claim 4 wherein said pulse means includes;

a plurality of serially connected shift registers for storing and shifting a logic signal from one shift register to the next in response to each clock pulse, said shift registers each having an output forming one of said pulse outputs when said logic signal is stored in that register, flip-flop means having an input responsive to an input signal and program signals for entering a logic signal into the first register of said serially connected shift registers and switch means coupled to selectively provide an input signal to said flip-flop means input.

8. The system of claim 4 wherein said logic means further includes a random frequency means for sampling a plurality of said pulse outputs and providing a frequency signal and an output of the sampled pulse outputs.

9. The system of claim 8 wherein said program means comprises a program card removably coupled to said logic means and so constructed as to deliver said frequency signal as the program signal to said pulse means for providing random pulse outputs and to couple the sampled pulse outputs to form a random frequency pattern of signals for energizing said electronic switch means.

10. The system of claim 4 wherein said logic means further includes means for detecting the zero crossing of an AC voltage and providing a synchronizing pulse and wherein said program means includes means for coupling said synchronizing pulse to synchronize said clock means with the zero crossing of said AC voltage.

11. The system of claim 4 further including,
firing circuit means coupled to receive pulse outputs from said pulse means and provide buffered control pulse outputs for energizing said electronic switch means.

12. The system of claim 11 wherein said electronic switch means includes a plurality of SCR switches each coupled to insert one of said resistive loads across said voltage output in response to a separate one of said buffered control pulse outputs.

13. The system of claim 11 further including;
means for providing a source of biasing potential, and
means responsive to said voltage output for coupling said source of biasing potential to provide power to the circuits of said logic means and said firing circuit means.

* * * * *